United States Patent
Bovo et al.

(10) Patent No.: US 11,152,572 B2
(45) Date of Patent: Oct. 19, 2021

(54) SOLVENT SYSTEMS FOR THE PREPARATION OF PHOTOSENSITIVE ORGANIC ELECTRONIC DEVICES

(71) Applicant: Sumitomo Chemical Company Limited, Tokyo (JP)

(72) Inventors: Gianluca Bovo, Godmanchester (GB); Nir Yaacobi-Gross, Godmanchester (GB)

(73) Assignee: Sumitomo Chemical Company Limited, Tokyo (JP)

( * ) Notice: Subject to any disclaimer, the term of this patent is extended or adjusted under 35 U.S.C. 154(b) by 75 days.

(21) Appl. No.: 16/336,812

(22) PCT Filed: Sep. 21, 2017

(86) PCT No.: PCT/GB2017/052820
§ 371 (c)(1),
(2) Date: Mar. 26, 2019

(87) PCT Pub. No.: WO2018/055379
PCT Pub. Date: Mar. 29, 2018

(65) Prior Publication Data
US 2020/0028085 A1    Jan. 23, 2020

(30) Foreign Application Priority Data
Sep. 26, 2016 (GB) ..................... 1616279

(51) Int. Cl.
*H01L 51/00* (2006.01)
*H01L 51/42* (2006.01)

(52) U.S. Cl.
CPC ...... *H01L 51/0007* (2013.01); *H01L 51/0036* (2013.01); *H01L 51/0043* (2013.01); *H01L 51/0047* (2013.01); *H01L 51/4253* (2013.01)

(58) Field of Classification Search
CPC ............. H01L 51/0007; H01L 51/0036; H01L 51/0043; H01L 51/0047; H01L 51/4253
See application file for complete search history.

(56) References Cited

U.S. PATENT DOCUMENTS

| 2003/0066950 A1 | 4/2003 | Halls et al. |
| 2006/0076050 A1* | 4/2006 | Williams ............... H01L 51/424 136/263 |

(Continued)

FOREIGN PATENT DOCUMENTS

| JP | 2013-042085 A | 2/2013 |
| JP | 2016-134464 A | 7/2016 |

(Continued)

OTHER PUBLICATIONS

International Search Report and Written Opinion for International Application No. PCT/GB2017/052820, dated Dec. 5, 2017.

(Continued)

*Primary Examiner* — Michael Jung
(74) *Attorney, Agent, or Firm* — Wolf, Greenfield & Sacks, P.C.

(57) ABSTRACT

This invention relates to a formulation comprising p-type and n-type organic semiconductors and a solvent mixture comprising an aromatic hydrocarbon substituted with one or more substituents selected from alkyl and alkoxy groups and a unsubstituted or substituted benzothiazole, for example 2-methylbenzothiazole. The formulation may be used to form the photoactive layer (3) of a photosensitive organic electronic device, for example an organic photodetector, comprising an anode (2) a cathode (4) and the photoactive layer between the anode and the cathode.

11 Claims, 4 Drawing Sheets

(56) References Cited

U.S. PATENT DOCUMENTS

| | | | | |
|---|---|---|---|---|
| 2012/0055536 A1* | 3/2012 | Saito | ............... | B82Y 10/00 136/245 |
| 2013/0014818 A1* | 1/2013 | Cotlet | ............... | H01L 51/426 136/256 |
| 2013/0069020 A1* | 3/2013 | May | ............... | H01L 51/0039 252/519.21 |
| 2014/0196787 A1* | 7/2014 | Hanaki | ............... | C08G 61/126 136/263 |
| 2014/0230900 A1* | 8/2014 | Cull | ............... | H01L 51/0007 136/263 |
| 2014/0319509 A1* | 10/2014 | Hattori | ............... | C08G 61/126 257/40 |
| 2015/0069304 A1* | 3/2015 | Blouin | ............... | C07C 13/62 252/500 |
| 2015/0206616 A1* | 7/2015 | He | ............... | C08G 61/126 427/58 |
| 2015/0249214 A1* | 9/2015 | Watanabe | ............... | H01L 51/0036 136/263 |
| 2015/0280142 A1* | 10/2015 | Arai | ............... | H01L 51/0072 136/263 |
| 2016/0056397 A1* | 2/2016 | Schumann | ............... | H01L 51/0036 136/256 |
| 2016/0181552 A1* | 6/2016 | May | ............... | H01L 51/0094 257/40 |
| 2016/0301005 A1* | 10/2016 | Pfister | ............... | A61P 29/00 |
| 2017/0237005 A1* | 8/2017 | Weitz | ............... | H01L 51/0007 438/99 |
| 2017/0237012 A1* | 8/2017 | Shen | ............... | C09D 11/033 257/40 |
| 2018/0358571 A1* | 12/2018 | Choi | ............... | H01L 31/022425 |

FOREIGN PATENT DOCUMENTS

| | | |
|---|---|---|
| WO | WO 2013/029733 A1 | 3/2013 |
| WO | WO 2016/034262 A1 | 3/2016 |

OTHER PUBLICATIONS

Combined Search and Examination Report for British Application No. GB1616279.4, dated Mar. 28, 2017.

Japanese Office Action dated Aug. 3, 2021 in connection with Japanese Application No. 2019-515868.

\* cited by examiner

FIGURE 4

SOLVENT SYSTEMS FOR THE PREPARATION OF PHOTOSENSITIVE ORGANIC ELECTRONIC DEVICES

RELATED APPLICATIONS

This Application is a national stage filing under 35 U.S.C. § 371 of international PCT application PCT/GB2017/052820, filed Sep. 21, 2017, which claims priority to United Kingdom patent application GB 1616279.4, filed Sep. 26, 2016, each of which is incorporated herein by reference in its entirety.

FIELD OF INVENTION

This invention relates to a formulation comprising p-type and n-type organic semiconductors and a solvent system, its use for manufacturing photosensitive organic electronic devices, and to photosensitive organic electronic devices, in particular organic photodetectors, prepared by using said formulations.

BACKGROUND OF THE INVENTION

There is an increased interest in the development of novel organic photosensitive electronic devices as alternatives to inorganic photoelectronic devices because they provide high flexibility and may be manufactured and processed at relatively low costs by using low temperature vacuum deposition or solution processing techniques.

As examples of organic photosensitive electronic devices, organic photovoltaic devices (OPV), photocells and photodetectors may be mentioned. Usually, such an organic photosensitive electronic device includes as a photoactive layer a p-n junction which is prepared by film deposition of a donor/acceptor blend from solution and enables the device to convert incident radiation into electrical current.

Typical examples of p-type materials are conjugated organic oligomers or polymers (e.g. oligomers or polymers of thiophenes, phenylenes, fluorenes, polyacetylenes, benzathiadiazoles and combinations thereof), whereas fullerene and fullerene derivatives (e.g. $C_{60}$PCBM and $C_{70}$PCBM) are known as n-type materials (see e.g. EP 1 447 860 A1 and US 2012/205596).

WO 2013/029733 discloses formulations comprising p-type organic semiconductor, a n-type organic semiconductor and a solvent selected from the group consisting of alkylated tetralin, alkylated naphthalene and alkylated anisole.

In the case of an organic photodetector device, the current flowing through the device in the absence of any photons incident on the device, known as dark current, may affect the limit of detection of the device.

It is an object of the invention to provide formulations for forming high efficiency organic photosensitive electronic devices.

It is a further object of the invention to provide formulations for forming organic photodetector devices with low dark current.

SUMMARY OF THE INVENTION

The present invention solves these objects with the subject matter of the claims as defined herein. The advantages of the present invention will be further explained in detail in the section below.

The present inventors have surprisingly found that the use of specific solvent mixtures in formulations comprising n-type and p-type organic semiconductors allows formation of organic photosensitive devices with excellent efficiency and, in the case of photodetector devices, low dark current.

In a first aspect, the invention provides a formulation comprising an n-type organic semiconductor, a p-type organic semiconductor and a solvent mixture wherein the solvent mixture comprises an alkylated aromatic hydrocarbon and an unsubstituted or substituted benzothiazole.

In a second aspect, the present invention relates to a method of manufacturing an organic photosensitive electronic device comprising an anode, a cathode and a photoactive layer between the cathode and the anode, the method comprising: applying the formulation of the first aspect over one of the anode and cathode to form a wet film; drying the wet film to provide the photoactive layer; and forming the other of the anode and cathode over the photoactive layer.

By formation of a layer "over" an underlying layer as used herein is meant that the layer is formed directly on the underlying layer or on an intervening layer between the layer so formed and the underlying layer. There may be no intervening layer or one or more intervening layers.

A third aspect of the present invention relates to an organic photosensitive electronic device comprising an anode, a cathode and a photoactive layer manufactured by the aforementioned method of the second aspect.

Preferred embodiments of the formulation according to the present invention and other aspects of the present invention are described in the following description and the claims.

DETAILED DESCRIPTION OF THE INVENTION

For a more complete understanding of the present invention, reference is now made to the following description of the illustrative embodiments thereof:

Semiconductor Formulation

In a first aspect, the present invention relates to a formulation comprising an n-type organic semiconductor, a p-type organic semiconductor and a solvent mixture wherein the solvent mixture comprises an aromatic hydrocarbon substituted with one or more substituents selected from alkyl and alkoxy groups and a unsubstituted or substituted benzothiazole.

Optionally, the aromatic hydrocarbon is benzene, preferably a compound of formula (I):

wherein $R^1$ in each occurrence independently represents a $C_1$-$C_6$ alkyl or a $C_1$-$C_6$ alkoxy group and n is at least 1, optionally 1, 2 or 3. In the case where n is 2 or more, two groups $R^1$ may be linked to form a ring which may be unsubstituted or substituted with one or more $C_{1-5}$ alkyl groups. In the case where n is 2 or more it is preferred that none of the $R^1$ groups are linked to form a ring. The or each $R^1$ is preferably methyl.

As specific examples of compounds according to formula (I), 1,2-dialkylbenzene (e.g. o-xylene), 1,2,4-trialkylbenzenes (e.g. 1,2,4-trimethylbenzene, 1,2,4-triethylbenzene, 1,2-dimethyl-4-ethylbenzene), 1,2,3-trialkylbenzenes (e.g. 1,2,3-trimethylbenzene, 1,2,3-triethylbenzene), indane and its alkyl-substituted derivatives, and tetralin and its alkyl-substituted derivatives may be mentioned.

Optionally, the unsubstituted or substituted benzothiazole is represented by formula (II):

wherein $R^2$ independently in each occurence represents a $C_1$-$C_6$ alkyl or a $C_1$-$C_6$ alkoxy group; $R^3$ represents H, a $C_1$-$C_6$ alkyl or a $C_1$-$C_6$ alkoxy group and m is 0, 1, 2, 3 or 4. Preferably, m is 0. Preferably, $R^3$ is a $C_1$-$C_6$ alkyl, more preferably methyl.

Optionally, the unsubstituted or substituted benzothiazole has a boiling point in the range of 200-300° C., optionally 200-250° C.

Optionally, the substituted aromatic hydrocarbon is present in a content range of from 50 to 99.5 volume % based on the total volume of the solvent mixture, preferably 70-99 volume %.

Optionally, the unsubstituted or substituted benzothiazole is present in a content range of from 0.5 to 50 volume % based on the total volume of the solvent mixture, preferably 1-20 volume %.

Optionally, the volume ratio of the substituted aromatic hydrocarbon:the unsubstituted or substituted benzothiazole is within the range of from 70:30 to 99.5:0.5 or 70:30 to 99:1 or 70:30 to 98:2.

While it may be preferable that the solvent mixture consists of the substituted aromatic hydrocarbon and the unsubstituted or substituted benzothiazole, the solvent mixture may comprise one or more further solvents. The or each further solvents may be selected from materials that are liquid at 25° C. and 1 atm and in which one or both of the n-type OSC and the p-type OSC or both are soluble at a solubility of 0.2 mg/ml or more. Such additional solvents are not particularly limited and may be appropriately selected by the skilled artisan. Exemplary further solvents include, without limitation, naphthalene, linear or cyclic ketones (e.g. cyclohexanone), aliphatic ethers, aliphatic or aromatic alcohols, optionally substituted thiophenes and chlorinated solvents (e.g. chlorobenzene, trichlorobenzene, dichlorobenzene or chloroform) and mixtures thereof. From the viewpoint of environment-friendliness it is, however, preferred that the solvent mixture does not comprise any chlorinated solvents. If present, the additional solvents are optionally comprised at a total content of less than 3 vol. %, more preferably less than 2 vol. % relative to the total solvent volume.

Optionally, the solvent mixture does not comprise an arylbenzoates, for example benzylbenzoate. Optionally, the solvent mixture does not comprise an alkylbenzoate.

The p-type OSC is not particularly limited and may be appropriately selected from standard electron donating materials that are known to the person skilled in the art and are described in the literature, including organic polymers, oligomers and small molecules. In a preferred embodiment the p-type OSC comprises an organic conjugated polymer, which can be a homopolymer or copolymer including alternating, random or block copolymers. Preferred are non-crystalline or semi-crystalline conjugated organic polymers. Further preferably the p-type organic semiconductor is a conjugated organic polymer with a low bandgap, typically between 2.1 eV and 1.1 eV, preferably between 1.9 eV and 1.1 eV, and most preferably between 1.7 eV and 1.1 eV. As exemplary p-type OSC polymers, polymers selected from conjugated hydrocarbon or heterocyclic polymers including polyacene, polyaniline, polyazulene, polybenzofuran, polyfluorene, polyfuran, polyindenofluorene, polyindole, polyphenylene, polypyrazoline, polypyrene, polypyridazine, polypyridine, polytriarylamine, poly(phenylene vinylene), poly(3-substituted thiophene), poly(3,4-bisubstituted thiophene), polyselenophene, poly(3-substituted selenophene), poly(3,4-bisubstituted selenophene), poly(bisthiophene), poly(terthiophene), poly(bisselenophene), poly(terselenophene), polythieno[2,3-b]thiophene, polythieno[3,2-b]thiophene, polybenzothiophene, polybenzo[1,2-b:4,5-b']dithiophene, polyisothianaphthene, poly(monosubstituted pyrrole), poly(3,4-bisubstituted pyrrole), poly-1,3,4-oxadiazoles, polyisothianaphthene, derivatives and copolymers thereof may be mentioned. Preferred examples of p-type OSCs are copolymers of polyfluorenes and polythiophenes, each of which may be substituted, and polymers comprising benzothiadiazole-based and thiophene-based repeating units, each of which may be substituted. It is understood that the p-type OSC may also consist of a mixture of a plurality of electron donating materials.

The p-type OSC preferably comprises a repeat unit of formula (III):

wherein $R^3$ in each occurrence is independently H or a substituent.

Optionally, each $R^3$ is independently selected from the group consisting of $C_{1-20}$ alkyl wherein one or more non-adjacent, non-terminal carbon atoms of the alkyl group may be replaced with O, S or C=O and wherein one or more H atoms of the $C_{1-20}$ alkyl may be replaced with F; an aryl or heteroaryl group, preferably phenyl, which may be unsubstituted or substituted with one or more substituents; and fluorine.

Substituents of an aryl or heteroaryl group are optionally selected from F, CN, $NO_2$ and $C_{1-20}$ alkyl wherein one or more non-adjacent, non-terminal carbon atoms of the alkyl group may be replaced with O, S or C=O.

By "non-terminal" as used herein is meant a carbon atom other than the methyl group of a linear alkyl (n-alkyl) chain and the methyl groups of a branched alkyl chain.

Preferably, each $R^3$ is fluorine.

A polymer comprising a repeat unit of formula (I) is preferably a copolymer comprising one or more co-repeat units. The one or more co-repeat units may comprise or consist of one or more of $C_{6-20}$ monocyclic or polycyclic arylene repeat units which may be unsubstituted or substituted with one or more substituents; 5-20 membered monocyclic or polycyclic heteroarylene repeat units which may be unsubstituted or substituted with one or more substituents.

The one or more co-repeat units may have formula (IV):

(IV)

wherein $Ar^1$ in each occurrence is an arylene group or a heteroarylene group; x is at least 1; $R^{17}$ in each occurrence is independently a substituent; y independently in each occurence is 0 or a positive integer, optionally 0, 1, 2, 3 or 4; and two groups $R^{17}$ may be linked to form a ring.

Optionally, each $R^{17}$ is independently selected from the group consisting of a linear, branched or cyclic $C_{1-20}$ alkyl wherein one or more non-adjacent, non-terminal C atoms of the $C_{1-20}$ alkyl may be replaced with O, S, COO or CO.

Two groups $R^{17}$ may be linked to form a $C_{1-10}$ alkylene group wherein one or more non-adjacent C atoms of the alkylene group may be replaced with O, S, COO or CO.

Optionally, x is 2.

Optionally, each $Ar^1$ is independently a 5 or 6 membered heteroarylene group, optionally a heteroarylene group selected from the group consisting of thiophene, furan, selenophene, pyrrole, diazole, triazole, pyridine, diazine and triazine, preferably thiophene.

Optionally, the repeat unit of formula (IV) has formula (IVa):

(IVa)

Optionally, the groups $R^{17}$ are linked to form a 2-5 membered bridging group. Optionally, the bridging group has formula —O—C($R^{18}$)$_2$— wherein $R^{18}$ in each occurrence is independently H or a substituent. Substituents $R^{18}$ are optionally selected from $C_{1-20}$ alkyl. Preferably each $R^{18}$ is H.

A polymeric p-type OSC as described herein may have a polystyrene-equivalent number-average molecular weight (Mn) measured by gel permeation chromatography in the range of about $1×10^3$ to $1×10^8$, and preferably $1×10^3$ to $5×10^6$. The polystyrene-equivalent weight-average molecular weight (Mw) of the polymers described herein may be $1×10^3$ to $1×10^8$, and preferably $1×10^4$ to $1×10^7$ The n-type OSC is also not particularly limited and may be suitably selected from electron accepting materials known to the skilled artisan and may consist of a mixture of a plurality of electron accepting materials. As examples thereof, n-type conjugated polymers, fullerenes and fullerene derivatives may be mentioned. Preferably, the n-type OSC is a single type or a mixture of fullerenes and/or fullerene derivatives, including C60, C70, C76, C78, C84, C96, PCBM-type fullerene derivatives (including phenyl-C61-butyric acid methyl ester ($C_{60}$PCBM), TCBM-type fullerene derivatives (e.g. tolyl-C61-butyric acid methyl ester ($C_{60}$TCBM)), ThCBM-type fullerene derivatives (e.g. thienyl-C61-butyric acid methyl ester ($C_{60}$ThCBM).

Fullerene derivatives may have formula (V):

(V)

wherein A, together with the C—C group of the fullerene, forms a monocyclic or fused ring group which may be unsubstituted or substituted with one or more substituents.

Exemplary fullerene derivatives include formulae (Va), (Vb) and (Vc):

(Va)

(Vb)

(Vc)

wherein $R^4$-$R^{15}$ are each independently H or a substituent.

Substituents $R^4$-$R^{15}$ are optionally and independently in each occurrence selected from the group consisting of aryl or heteroaryl, optionally phenyl, which may be unsubstituted or substituted with one or more substituents; and $C_{1-20}$ alkyl wherein one or more non-adjacent, non-terminal C atoms may be replaced with O, S, CO or COO and one or more H atoms may be replaced with F.

Substituents of aryl or heteroaryl, where present, are optionally selected from $C_{1-12}$ alkyl wherein one or more non-adjacent, non-terminal C atoms may be replaced with O, S, CO or COO and one or more H atoms may be replaced with F.

As further examples of fullerene derivatives, those disclosed in WO 2004/073082 A1, US 2011/0132439 A1, WO 2015/036075 A1, and US 2011/0132439 A1 may be mentioned, the contents of which are incorporated herein by reference.

The weight ratio of p-type material to n-type material present in the formulation is optionally in the range of 10:1 to 1:10, more preferably 4:1 to 1:4, especially preferably 1:1 to 1:3.

Preferably, the ink concentration, i.e. the concentration of n- and p-type material in the solvent mixture, is in the range of from 0.1 to 10.0 w/v %, more preferably from 1.0 to 6 w/v %.

The formulation may comprise further components in addition to the n-type organic semiconductor, the p-type organic semiconductor and the solvent mixture. As examples of such components, adhesive agents, defoaming agents, deaerators, viscosity enhancers, diluents, auxiliaries, flow improvers colourants, dyes or pigments, sensitizers, stabilizers, nanoparticles, surface-active compounds, lubricating agents, wetting agents, dispersing agents and inhibitors may be mentioned.

It will be appreciated that the preferred features specified above may be combined in any combination, except for combinations where at least some of the features are mutually exclusive.

The above-defined formulations serve as a starting material for the solution deposition of photoactive layers of organic photosensitive devices, in particular photodetectors with excellent performance.

Organic Photosensitive Electronic Devices and Methods for Manufacturing the Same In a second embodiment, the present invention relates to a method of manufacturing an organic photosensitive electronic device comprising an anode, a cathode and a photoactive layer between the cathode and the anode, the method comprising: applying the formulation according to the above-described first embodiment over one of the anode and cathode to form a wet film; drying the wet film to provide the photoactive layer; and forming the other of the anode and cathode over the photoactive layer.

Figure 1:
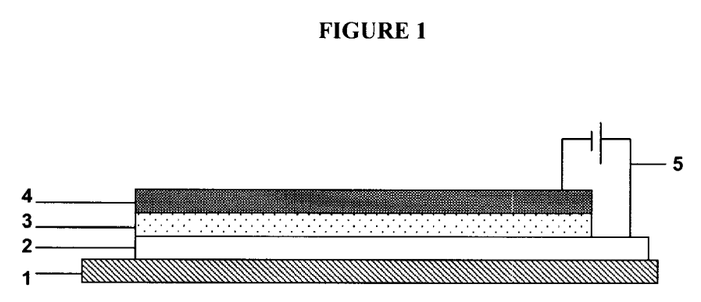
FIG. 1 schematically illustrates a photodetector device.

A typical general architecture of an organic photosensitive electronic device according to the present invention is schematically depicted in FIG. 1. Herein, an anode 2 usually consisting of a high work-function material is deposited onto a substrate 1 made of a material transparent to visible light. Typical anode materials include conductive metal oxides, such as indium tin oxide (ITO) and indium zinc oxide (IZO), aluminum zinc oxide (AlZnO), and metals (e.g. gold), while glass or plastics are conventionally used as substrate materials. Between the anode 2 and the cathode 4, which may be made of metals (e.g. Ag, Ag:Mg) or metal oxides, the photoactive layer 3 comprising a bulk heterojunction comprising or consisting of a mixture of the n-type OSC and the p-type OSC formed by solution deposition of the formulation according to the first embodiment. A contact 5 is provided between the anode 2 and cathode 4, which may include a voltage source for applying a reverse bias to the device and a detector (e.g. current meter or readout device, wired in series with the reverse bias voltage source, as detection circuit), for example, to measure the generated photocurrent.

It is to be understood that FIG. 1 serves illustrative purposes only and one or more further layers may be present in the device, such as e.g. electron blocking layers (EBL), hole-injecting layers (HIL), electron-injecting layers (EIL), exciton-blocking layer (XBL), spacer layers, connecting layers, hole-blocking layers (HBL) and electrode-modification layers for modifying the work function of an electrode.

It will be appreciated that the anode may be supported on a substrate, as illustrated in FIG. 1, and the formulation may be deposited over the anode to form the photoactive layer followed by formation of the cathode, or the cathode may be supported on a substrate in which case the formulation may be deposited over the cathode to form the photoactive layer followed by formation of the anode.

The formulation according to the present invention can be applied by any suitable solution deposition method, including but not limited to, spin-coating, dip-coating, roll-coating, spray coating, doctor blade coating, wire bar coating, slit coating, ink jet printing, letter-press printing, dispense printing screen printing, gravure printing, offset lithography printing and flexographic printing Dispense printing of the active layers of an OPD is a step towards simple additive fabrication process for integrating OPDs with other components. Herein, a continuous flow of ink is deposited from a nozzle positioned in a defined distance from the substrate. The desired pattern is created by a relative movement of the nozzle and the substrate.

By controlling the nozzle dispense rate (solution flow rate), the pattern density (line spacing), the nozzle movement speed (line speed) as well as the ink concentration, the uniformity of the photoactive layer film may be tuned.

After the formulation has been solution deposited to form the wet film, the solvent mixture is dried. Solvent may be evaporated from the wet film by drying at ambient temperature and pressure, by heating the deposited wet film, optionally to a temperature in the range of 50-200° C., and/or by application of reduced pressure, optionally a pressure in the range of 0.01 to 0.1 mbar, preferably immediately upon formation of the wet film.

The thickness of the photoactive layer produced after removal of solvent is preferably from 10 nm to 3 μm, more preferably from 20 nm to 2 μm.

The photoactive layer may be homogenous or phase-separated and may contain different phases which phases may differ in the ratio of p-type to n-type material. The photoactive layer may have a substantially uniform ratio throughout the thickness of the photoactive layer or the ratio of p-type to n-type material may vary gradually or stepwise throughout the thickness of the photoactive layer.

In a third aspect, the present invention relates to an organic photosensitive electronic device comprising an anode, a cathode and a photoactive layer formed from a formulation according to the first embodiment between the cathode and the anode, or formed by a method according to the second aspect, respectively.

An illustrative example of the organic photosensitive device of the present invention is depicted in FIG. 1.

The organic photosensitive electronic device may be a photovoltaic device or a solar cell, a photoconductor cell or a photodetector, for example, each of which may be operated as a single device or in an array depending on the desired purpose. In the case of a photodetector, an array of photodetectors may be used, each photodetector being associated with one or more light sources. In order to take full advantage of the benefits of the present invention, the organic photosensitive electronic device of the present invention is preferably an organic photodiode, which is operated in photoconductive mode (wherein external voltage, the so-called reverse bias voltage is applied) and thereby functions as a photoconductor cell or a photodetector, as opposed to a solar cell, which is operated in photovoltaic mode (with zero bias voltage).

An organic photodetector as described herein may be used in a wide range of applications including, without limitation, detecting the presence and/or brightness of ambient light and in a sensor comprising at least one organic photodetector as described herein and at least one light source. The photodetector may be configured such that light emitted from a light source is incident on the photodetector and changes in wavelength and/or brightness of the light may be detected.

An array of photodetectors as described herein may be configured to detect light emitted from a single light source or from two or more light sources. The sensor may be, without limitation, a gas sensor, a biosensor, X-ray imaging or a motion sensor, for example a motion sensor used in security applications, a proximity sensor or a fingerprint sensor.

EXAMPLES

Formulation Examples

Formulations were prepared comprising the fullerene C70-IPH or C70-IPB as the n-type organic semiconductor (63 wt %) and a p-type organic semiconductor polymer having structural formula (1) (37 wt %), or the fullerene C70-PCBM as the n-type organic semiconductor (67 wt %) and a p-type organic semiconductor polymer having structural formula (1) (33 wt %), in a solvent mixture of 1,2,4-trimethylbenzene (Solvent A) and a solvent set out in Table 1 (Solvent B).

(1)

C70-PCBM

C70-IPH: R = hexyl
C70-IPB: R = butyl

TABLE 1

| Formulation | Fullerene | Solvent B | Solvent A:Solvent B ratio (v/v) | Solvent B boiling point | Solvent B Hansen solubility Distance to donor | Distance to acceptor |
|---|---|---|---|---|---|---|
| Comparative Formulation 1 | C70-IPH | Benzyl benzoate | 90:10 | 323 | 5.006 | 2.506 |
| Formulation Example 1 | C70-IPH | 2-methylbenzothiazole | 90:10 | 238 | 4.978 | 2.516 |
| Formulation Example 2 | C70-IPH | 2-methylbenzothiazole | 85:15 | 238 | 4.978 | 2.516 |
| Formulation Example 3 | C70-IPH | 2-methylbenzothiazole | 95:5 | 238 | 4.978 | 2.516 |
| Comparative Formulation 2 | C70-PCBM | 4-t-butylpyridine | 90:10 | 197 | 4.192 | 2.521 |
| Formulation Example 4 | C70-PCBM | 2-methylbenzothiazole | 90:10 | 238 | 4.978 | 2.516 |
| Comparative Formulation 3 | C70-IPB | Propyl benzoate | 95:5 | 230 | 4.896 | 0.880 |
| Comparative Formulation 4 | C70-IPB | Butyl benzoate | 95:5 | 249 | 5.788 | 1.643 |
| Comparative Formulation 5 | C70-IPB | Hexyl benzoate | 95:5 | 272 | 4.484 | 1.765 |
| Comparative Formulation 6 | C70-IPB | Benzyl benzoate | 90:10 | 323 | 5.006 | 2.506 |

Device Examples 1-3

A device having the following structure was prepared:
Cathode/Donor: Acceptor layer/Anode
Device Examples 1-3 were formed by coating Formulation Examples 1-3 respectively by wire bar coating onto a glass substrate coated with a layer of indium-tin oxide (ITO) and a layer of poly(ethyleneimine) (PEIE) to form a photoactive layer having a thickness of about 900 nm. The anode was formed over the photoactive layer by spin-coating a hole-transporting material available from Heraeus, Inc.

Comparative Device 1

A device was prepared as described with reference to Device Examples 1-3 except that Comparative Formulation 1 was used in place of Formulation Example 1.

Figure 2A:
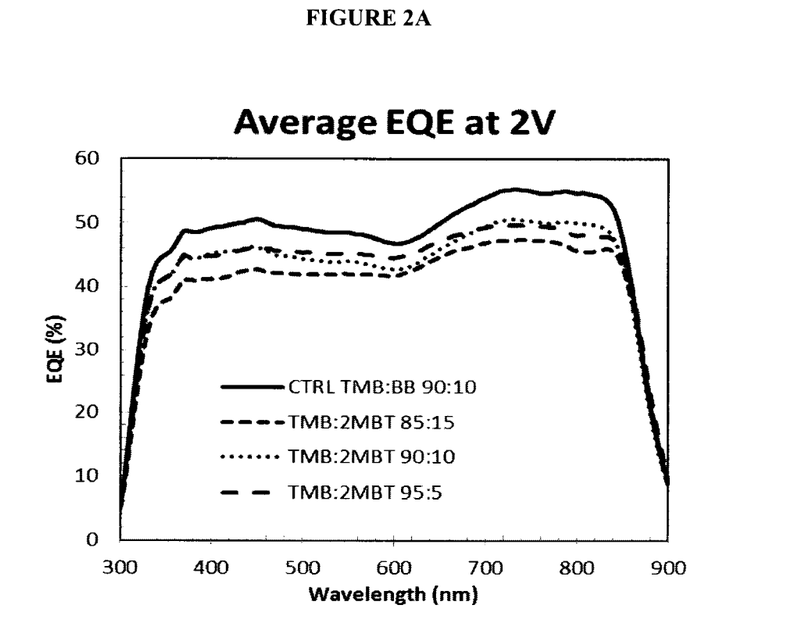
FIG. 2A is a graph of external quantum efficiency vs. wavelength for a comparative device formed using a comparative formulation containing benzyl benzoate solvent and devices formed using formulations according to embodiments of the invention containing 2-methylbenzothiazole solvent.

With reference to FIG. 2A, the external quantum efficiency of Comparative Device 1, formed using Comparative Formulation 1 containing 1,2,4-trimethylbenzene (TMB) and benzyl benzoate (BB) is similar to the efficiencies of Device Examples 1-3 formed using Formulation Examples 1-3 respectively, containing 2-methylbenzothiazole (2MBT). However, with reference to FIG. 2B, the dark current of Comparative Device 1 is considerably higher than that of any of Device Examples 1-3.

Device Example 4

A device having the following structure was prepared:
Cathode/Donor: Acceptor layer/Hole-transport layer/Anode
Formulation Example 4 was deposited by spin-coating onto a glass substrate coated with a layer of indium-tin oxide (ITO) and a layer of poly(ethyleneimine) (PEIE) to form a photoactive layer having a thickness of about 350 nm. The hole-transporting layer was formed over the photoactive layer by spin-coating a hole-transporting material available from Solvay. The anode was formed by spin-coating silver nanowires.

Comparative Device 2

A device was prepared as described with reference to Device Example 4 except that Comparative Formulation 2 was used in place of Formulation Example 4

Figure 3A:
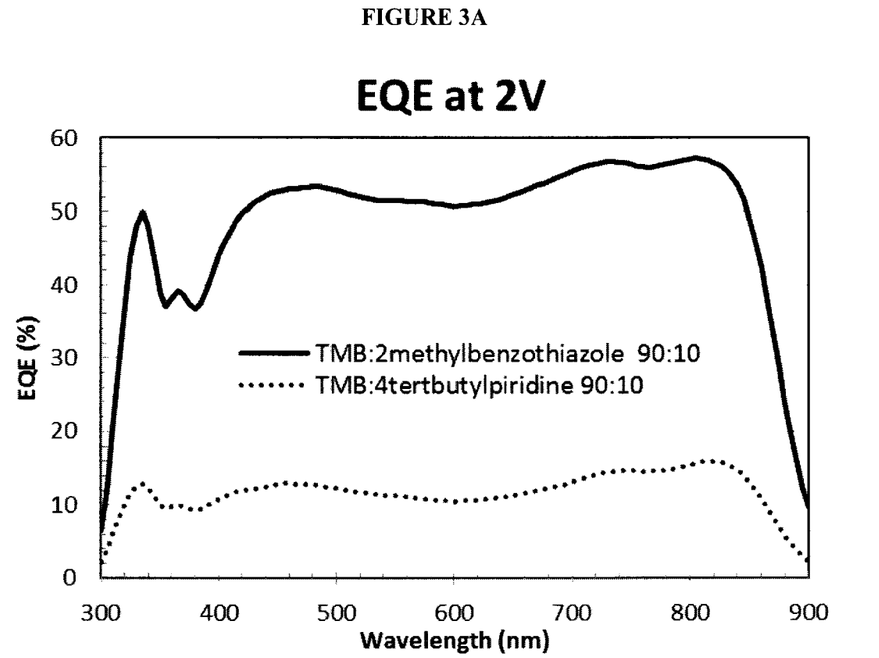
FIG. 3A is a graph of external quantum efficiency vs. wavelength for a comparative device formed using a comparative formulation containing 4-t-butylpyridine solvent and devices formed using formulations according to embodiments of the invention containing 2-methylbenzothiazole solvent.
Figure 3B:
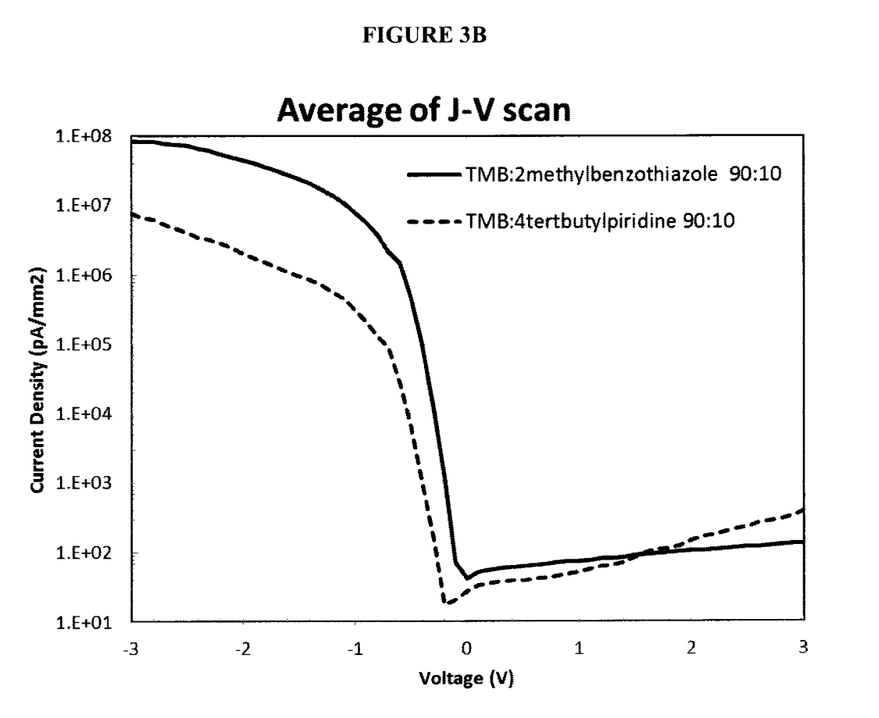
FIG. 3B is a graph of current density vs. reverse bias voltage for the devices of FIG. 3A.

The lower boiling solvent 4-tert-butylpyridine used to form Comparative Device 2 results in very low external quantum efficiency compared to Device Example 4 as shown in FIG. 3A and, as shown in FIG. 3B, higher dark current at a reverse bias of 3 V and lower conductivity when forward biased.

Comparative Devices 3-6

Comparative Devices 3-6 were prepared as described with reference to Device Example 4 except that Comparative Formulations 3-6 containing propyl benzoate (PB), butyl benzoate (BuB), hexylbenzoate (HB) and benzyl benzoate (BB) respectively were used in place of Formulation Example 4.

Figure 2B:
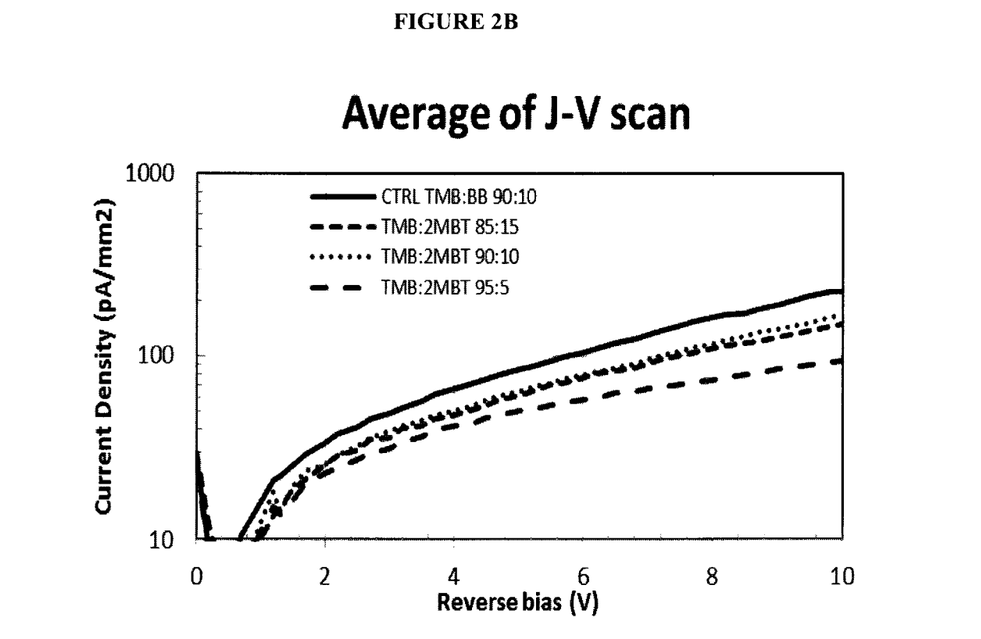
FIG. 2B is a graph of current density vs. voltage for the devices of FIG. 2A.
Figure 4:
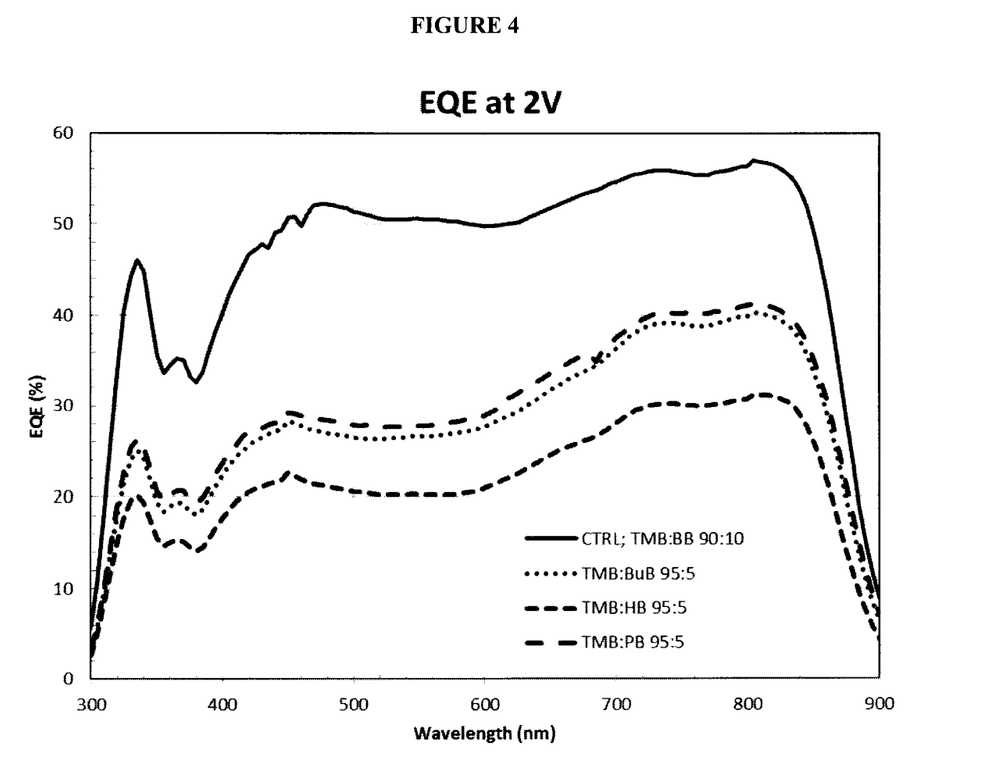
FIG. 4 is a graph of external quantum efficiency vs. wavelength for comparative devices formed using comparative formulations containing benzyl benzoate, butylbenzoate, propylbenzoate or hexylbenzoate solvent.

With reference to FIG. 4, external quantum efficiencies of Comparative Devices 3-5 are low despite the solvents used in place of 2-methylbenzothiazole having a similar solubility and boiling point to 2-methylbenzothiazole. Comparative Formulation 6 contains benzylbenzoate. Although external quantum efficiency of Comparative Device 6 formed from this formulation is relatively high, it is shown in FIG. 2B that use of benzylbenzoate in place of 2-methylbenzothiazole results in relatively high dark current.

Surprisingly, the exemplary formulations provide better external quantum efficiency and low dark current than comparative formulations in which the solvents have similar boiling points and Hansen solubilities.

Although the present invention has been described in terms of specific exemplary embodiments, it will be appreciated that various modifications, alterations and/or combinations of features disclosed herein will be apparent to those skilled in the art without departing from the scope of the invention as set forth in the following claims.

REFERENCE NUMERALS

1: substrate layer
2: anode
3: photoactive layer
4: cathode
5: contact

The invention claimed is:

1. A formulation comprising
(1) an n-type organic semiconductor, wherein the n-type organic semiconductor is fullerene or a fullerene derivative;
(2) a p-type organic conjugated polymer; and
(3) a solvent mixture wherein the solvent mixture comprises: (a) a benzene substituted with one or more substituents selected from alkyl and alkoxy groups; and (b) an unsubstituted or substituted benzothiazole of formula (II):

(II)

wherein $R^2$ independently in each occurence is a $C_1$-$C_6$ alkyl or a $C_1$-$C_6$ alkoxy group; $R^3$ is a $C_1$-$C_6$ alkyl or a $C_1$-$C_6$ alkoxy group; and m is 0, 1, 2, 3 or 4.

2. The formulation according to claim 1, wherein the benzene substituted with one or more substituents is represented by formula (I):

(I)

wherein $R^1$ in each occurrence independently represents a $C_1$-$C_6$ alkyl or a $C_1$-$C_6$ alkoxy group and n is at least 1.

3. The formulation according to claim 1 wherein the unsubstituted or substituted benzothiazole has a boiling point in the range of 200-300° C.

4. The formulation according to claim 1 wherein the substituted benzene is present in a content range of from 50 to 99.5 volume % based on the total volume of the solvent mixture.

5. The formulation according to claim 1 wherein the unsubstituted or substituted benzothiazole is present in a content range of from 0.5 to 50 volume % based on the total volume of the solvent mixture.

6. The formulation according to claim 1 wherein the volume ratio of the substituted benzene:the unsubstituted or substituted benzothiazole is within the range of from 70:30 to 99.5:0.5.

7. The formulation according to claim 1 wherein the solvent mixture does not comprise alkylbenzoates or arylbenzoates.

8. The formulation according to claim 1 wherein the solvent mixture consists of the substituted benzene and the unsubstituted or substituted benzothiazole.

9. A method of manufacturing an organic photosensitive electronic device comprising an anode, a cathode and a photoactive layer between the cathode and the anode, the method comprising:
applying the formulation according to claim 1 by a solution deposition method to form a wet film;
drying the wet film to provide the photoactive layer; and
forming the other of the anode and cathode over the photoactive layer.

10. An organic photosensitive electronic device comprising an anode, a cathode and a photoactive layer, manufactured by the method according to claim 9.

11. The organic photosensitive electronic device according to claim 10, wherein the organic photosensitive electronic device is an organic photodetector.

* * * * *